US012176903B1

United States Patent
Chang et al.

(10) Patent No.: US 12,176,903 B1
(45) Date of Patent: Dec. 24, 2024

(54) DUTY CYCLE CORRECTION DEVICE FOR USE IN CASCADED CIRCUITS AND RELATED LARGE TOUCH AND DISPLAY DRIVER INTEGRATION SYSTEM

(71) Applicant: HIMAX TECHNOLOGIES LIMITED, Tainan (TW)

(72) Inventors: Yaw-Guang Chang, Tainan (TW); Kai Chang, Tainan (TW); Pei-Yao Chang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 18/221,368

(22) Filed: Jul. 12, 2023

(51) Int. Cl.
*H03K 3/017* (2006.01)
*H03K 5/135* (2006.01)
*H03K 5/156* (2006.01)
*H03L 7/099* (2006.01)

(52) U.S. Cl.
CPC ............ *H03K 3/017* (2013.01); *H03K 5/135* (2013.01); *H03K 5/1565* (2013.01); *H03L 7/0992* (2013.01)

(58) Field of Classification Search
CPC ...... H03K 3/017; H03K 5/135; H03K 5/1565; H03L 7/0992
USPC .................................................. 327/147–161
See application file for complete search history.

(56) References Cited

U.S. PATENT DOCUMENTS

| | | | | |
|---|---|---|---|---|
| 6,211,849 | B1* | 4/2001 | Sasaki | G09G 3/20 345/55 |
| 7,375,563 | B1* | 5/2008 | Cheung | H03L 7/18 327/147 |
| 10,547,298 | B1* | 1/2020 | Mekky | H03K 7/08 |
| 2008/0260087 | A1* | 10/2008 | Liang | H03L 7/099 375/376 |
| 2009/0128207 | A1* | 5/2009 | Chang | H03K 5/1565 327/175 |
| 2012/0306552 | A1* | 12/2012 | Erdogan | H03L 7/0812 327/158 |
| 2013/0257499 | A1 | 10/2013 | Wang | |
| 2014/0340132 | A1* | 11/2014 | Terrovitis | H03L 7/0814 327/157 |
| 2023/0195672 | A1 | 6/2023 | Wen | |

OTHER PUBLICATIONS

Neil Storey, Electronics—A systems approach, Chapter 23 Digital Systems, p. 584-586, XP093163870 ,Jan. 1, 2009.

* cited by examiner

Primary Examiner — John W Poos
(74) Attorney, Agent, or Firm — Winston Hsu (57) ABSTRACT

A duty cycle correction device includes: a phase-locked Loop (PLL)-based duty cycle correction circuit, a bypass duty cycle correction circuit and a multiplexer. The PLL-based duty cycle correction circuit is configured to receive and correct an input clock signal to generate a PLL-based corrected signal. The bypass duty cycle correction circuit is configured to be clocked by the input clock signal to sample a logic signal at its input terminal to generate a bypass corrected signal. The multiplexer is coupled to the PLL-based duty cycle correction circuit and the bypass duty cycle correction circuit and is configured to select one of the PLL-based corrected signal, the bypass corrected signal and the input clock signal as an output clock signal.

8 Claims, 7 Drawing Sheets

DUTY CYCLE CORRECTION DEVICE FOR USE IN CASCADED CIRCUITS AND RELATED LARGE TOUCH AND DISPLAY DRIVER INTEGRATION SYSTEM

BACKGROUND OF THE INVENTION

1. Field of the Invention

The present invention relates to duty cycle correction, and more particularly, to a duty cycle correction device for use in cascaded circuits and related large touch and display driver integration system.

2. Description of the Prior Art

Touch and Display Driver Integration (TDDI) is an innovative semiconductor design technique that integrates touch controller and display driver into a single integrated circuit (IC). This technology is primarily applied in touch screen display devices, such as smartphones and tablet computers. The major advantage of TDDI lies in its ability to reduce manufacturing complexity, save space, and potentially improve performance by eliminating the need for separate touch controller and display driver ICs.

Large Touch and Display Driver Integration (LTDI) is an advancement of the TDDI technology, specifically designed for large or ultra-large touch display applications. LTDI embodies the same fundamental concept of integrating the touch controller and display driver into a single IC but extends its capabilities to cater to larger, high-resolution touch display devices. Typically, the use of multiple LTDI ICs may be required under certain circumstances. For larger or higher-resolution displays, a single LTDI IC may not have sufficient driving capability to handle all the pixels effectively. In this case, the display device can be divided into several regions, each driven by a separate LTDI IC. In some designs, LTDI ICs may utilize the Serial Peripheral Interface (SPI) for communication. Under a broadcast mode of the SPI, multiple LTDI ICs are cascaded. All of the cascaded LTDI ICs share a same SPI clock, allowing data to be broadcast to all LTDI ICs.

However, when multiple ICs are connected in a cascade arrangement, issues related to signal integrity may arise due to physical constraints of the board and the components. One such concern is the distortion of duty cycle caused by resistance-capacitance (RC) effects. Long traces on a Printed Circuit Board (PCB) can act as transmission lines with inherent resistance (R) and capacitance (C). These RC effects are often a significant cause of duty cycle distortion in clock signals. In particular, the propagation delay caused by the RC time constant of these traces can lead to the widening or narrowing of the high/low-level durations of the clock signal, thereby distorting the duty cycle. These effects can accumulate over the series of ICs, potentially leading to significant duty cycle distortion in the last IC in the series, which might adversely affect the operation of the circuit. Thus, careful management of clock signals is necessary to prevent issues like the distortion of duty cycle of the clock signal.

SUMMARY OF THE INVENTION

With this in mind it is one object of the present invention to provide a duty cycle correction device that features a dual-pronged duty cycle correction mechanism. The first is a PLL-based duty cycle correction that effectively rectifies any distortion in a duty cycle of a clock signal. The second is a bypass duty cycle correction as an alternative. This bypass duty cycle correction mechanism is also designed to rectify distortions in the duty cycle of the clock signal, but it is particularly advantageous when the PLL-based duty cycle correction risks inducing severe jitter accumulation. The bypass duty cycle correction can be deployed to replace the PLL-based duty cycle correction under such circumstances, providing flexibility and improved performance.

According to one embodiment, a duty cycle correction device is provided. The duty cycle correction device comprises: a phase-locked Loop (PLL)-based duty cycle correction circuit, a bypass duty cycle correction circuit and a multiplexer. The PLL-based duty cycle correction circuit is configured to correct a duty cycle of an input clock signal to generate a PLL-based corrected signal. The bypass duty cycle correction circuit is coupled to the PLL-based duty cycle correction circuit and configured to be clocked by the input clock signal to sample a logic signal to correct the duty cycle of the input clock signal, thereby generating a bypass corrected signal. The multiplexer is coupled to the PLL-based duty cycle correction circuit and the bypass duty cycle correction circuit and configured to select one of the PLL-based corrected signal, the bypass corrected signal and the input clock signal as an output clock signal.

According to one embodiment, a display and touch control system is provided. The display and touch control system comprises a plurality of display and touch control circuits in a cascade arrangement. Each of the display and touch control circuits has a clock input terminal, a clock output terminal, a data input terminal, a data output terminal. The clock output terminal of one of the display and touch control circuits is coupled to the clock input terminal of a succeeding one of the display and touch control circuits. Each display and touch control circuit comprises a duty cycle correction device. The duty cycle correction device comprises: a phase-locked Loop (PLL)-based duty cycle correction circuit, a bypass duty cycle correction circuit and a multiplexer. The PLL-based duty cycle correction circuit is configured to correct a duty cycle of an input clock signal at the clock input terminal to generate a PLL-based corrected signal. The bypass duty cycle correction circuit is coupled to the PLL-based duty cycle correction circuit and configured to be clocked by the input clock signal to sample a logic signal at its input terminal to correct the duty cycle of the input clock signal, thereby generating a bypass corrected signal. The multiplexer is coupled to the PLL-based duty cycle correction circuit and the bypass duty cycle correction circuit and configured to select one of the PLL-based corrected signal, the bypass corrected signal and the input clock signal as an output clock signal at the clock output terminal.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment" or "an embodiment" means that a particular feature, structure or characteristic described in connection with the embodiment or example is included in at least one embodiment of the present embodiments. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

Figure 1:
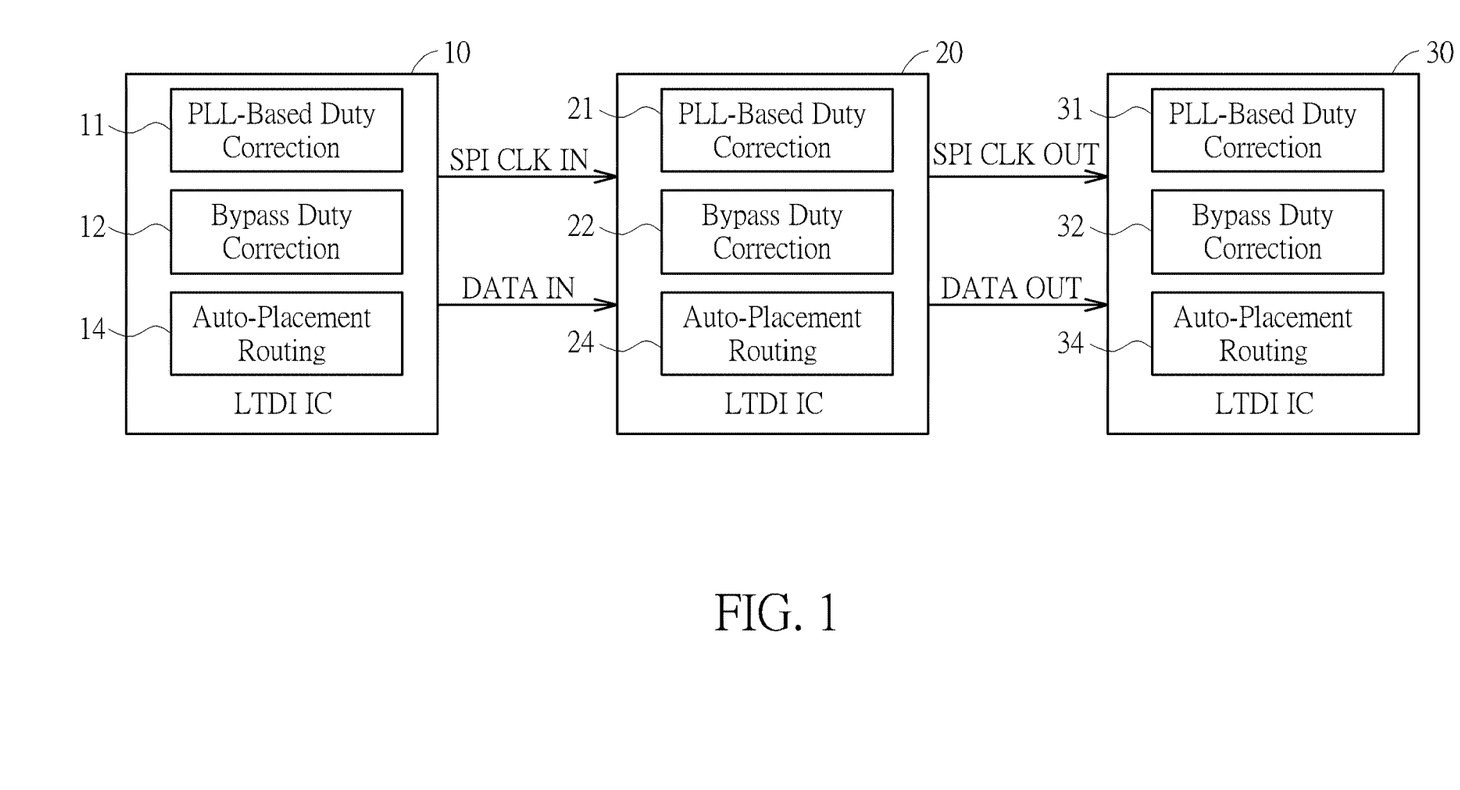
FIG. 1 illustrates LTDI ICs in a cascade arrangement according to one embodiment of the present invention.

FIG. 1 illustrates LTDI system according to one embodiment of the present invention. As depicted in FIG. 1, an LTDI system includes a plurality of LTDI integrated circuits (ICs) in a cascade arrangement. In one embodiment, the plurality of LTDI ICs comprises LTDI IC 10, LTDI IC 20 and LTDI IC 30. Please note that the number of LTDI ICs included in a single LTDI system is not a limitation of the present invention. According to various embodiment of the present invention, the number of LTDI ICs included in an LTDI system could be more than or fewer than "3". In this embodiment, the LTDI ICs 10, 20 and 30 utilizes the SPI interface to communicate with each other. Moreover, the LTDI ICs 10, 20 and 30 are operated in a broadcast SPI mode, where a clock output terminal of a LTDI IC (e.g., LTDI IC 10 and LTDI IC 20) is coupled to a clock input terminal of a succeeding LTDI IC (e.g., LTDI IC 20 and LTDI IC 30). Also, a data output terminal of an LTDI IC (e.g., LTDI IC 10 and LTDI IC 20) is coupled to a data input terminal of a succeeding LTDI IC (e.g., LTDI IC 20 and LTDI IC 30).

Each of the LTDI ICs 10, 20 and 30 includes a Phase-Locked Loop (PLL)-based duty cycle correction circuit (i.e., 11, 21 and 31), a bypass duty cycle correction circuit (i.e., 12, 22 and 32) and an auto-placement routing (i.e., 14, 24 and 34). Each of the LTDI ICs 10, 20 and 30 relies on the PLL-based duty cycle correction circuit (i.e., 11, 21 and 31), as well as the bypass duty cycle correction circuit (i.e., 12, 22 and 32) to correct the duty cycle of an input clock signal SPI_CLK_IN at its clock input terminal, thereby to generate an output clock signal SPI_CLK_OUT with a corrected duty cycle at its clock output terminal.

Figure 2:
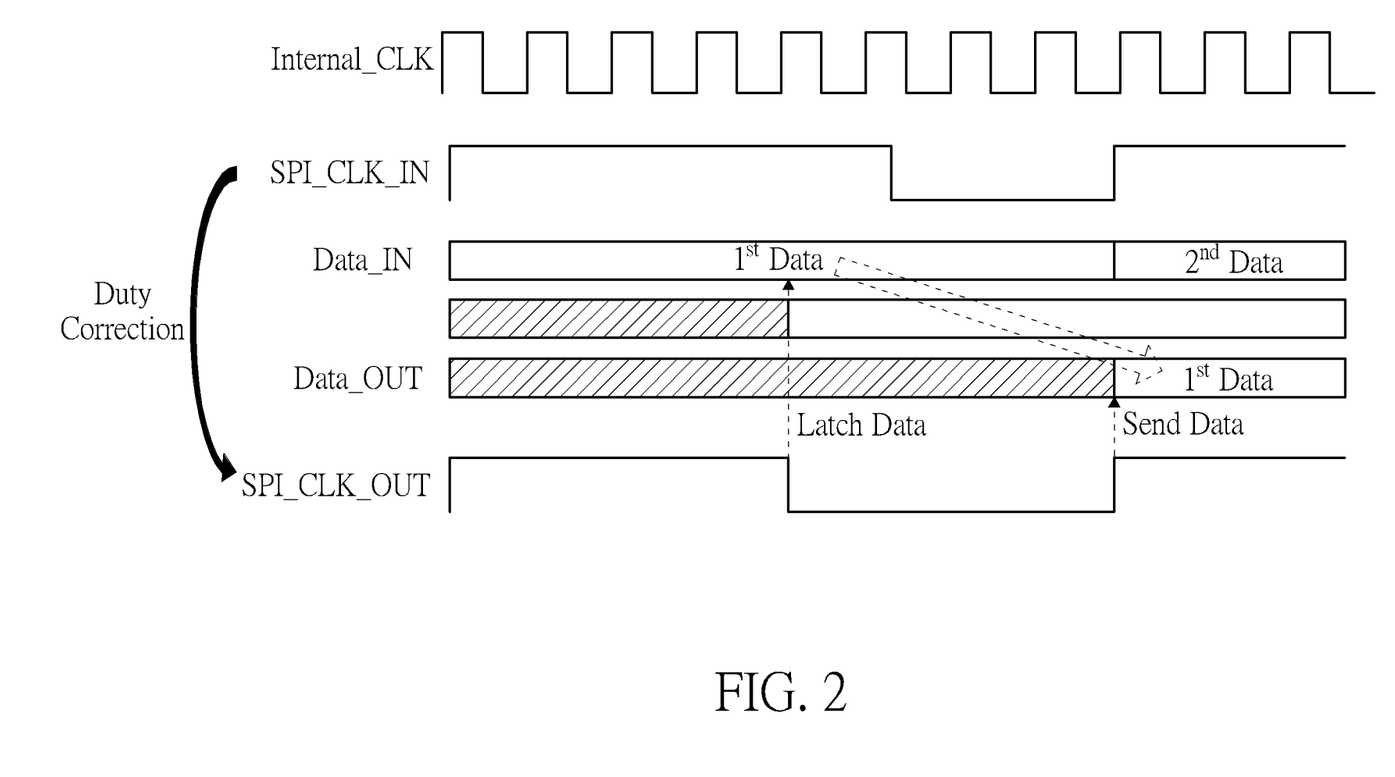
FIG. 2 illustrates a timing diagram of signals in an LTDI IC according to one embodiment of the present invention.

FIG. 2 illustrates a timing diagram of signals in an LTDI IC according to one embodiment of the present invention. As depicted, under the broadcast SPI mode, an LTDI IC (e.g., LTDI ICs 10, 20 and 30) latches a signal Data_IN at its data input terminal at a falling edge of the output signal clock signal SPI_CLK_OUT having the corrected duty cycle. Additionally, the latched data signal Data_OUT is sent to a succeeding LTDI IC through its data output terminal at a rising edge of the output signal clock signal SPI_CLK_OUT. As the output clock signal SPI_CLK_OUT has a corrected duty cycle, the data can be properly received and broadcasted by each of LTDI ICs 10, 20 and 30.

Figure 3:
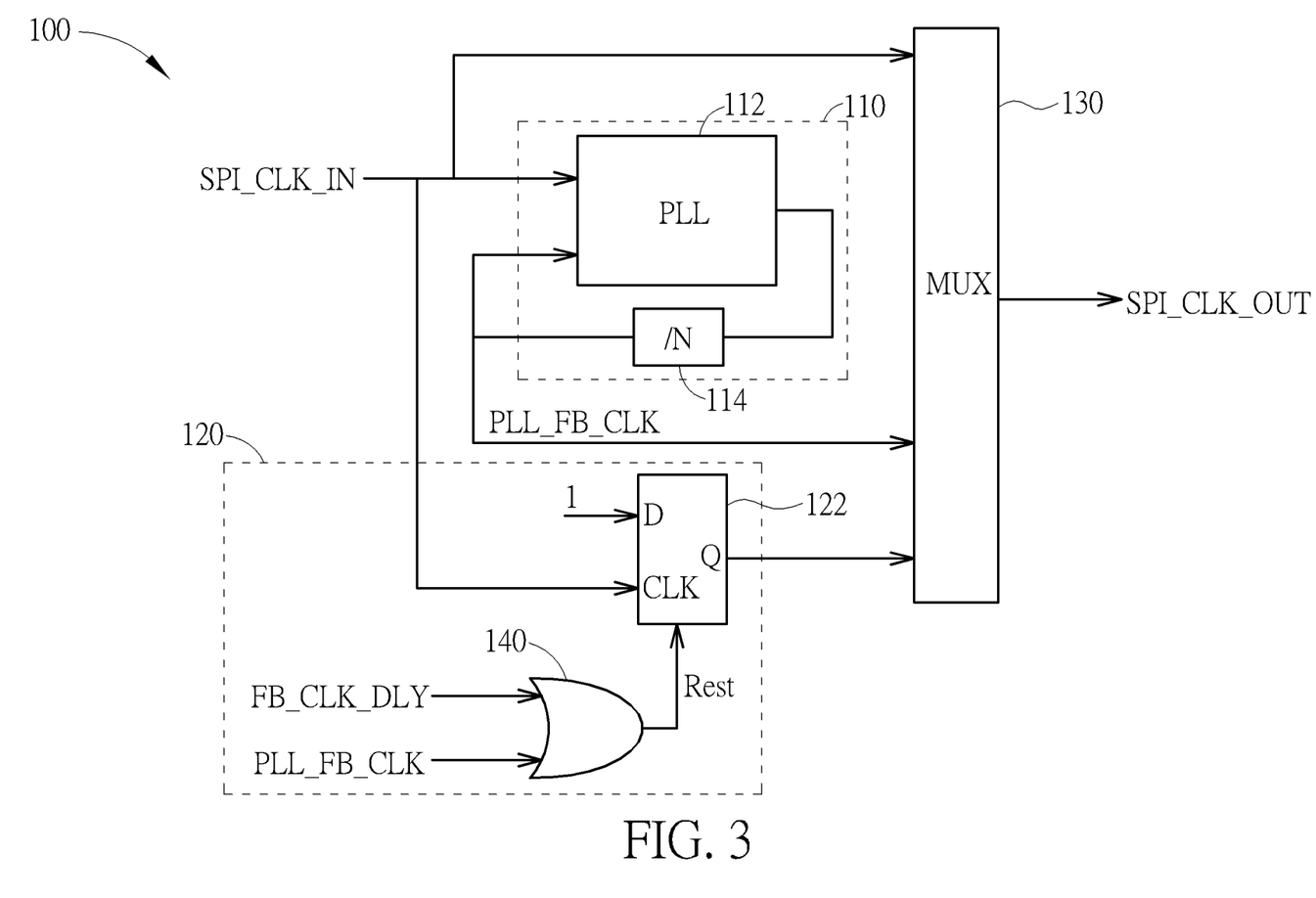
FIG. 3 illustrates a schematic diagram of a duty cycle correction device according to one embodiment of the present invention.

Please refer to FIG. 3, which illustrates a schematic diagram of a duty cycle correction device according to one embodiment of the present invention. As depicted, a clock correction device 100 comprises a PLL-based duty cycle correction circuit 110, a bypass duty cycle correction circuit 120 and a multiplexer 130. The clock correction device 100 receives an input clock signal SPI_CLK_IN and accordingly outputs an output clock signal SPI_CLK_OUT having a corrected duty cycle.

Both of the PLL-based duty cycle correction circuit 110 and the bypass duty cycle correction circuit 120 are configured to correct the duty cycle of the input clock signal SPI_CLK_IN. The PLL-based duty cycle correction circuit 110 is configured to correct the duty cycle of the input clock signal SPI_CLK_IN providing a PLL-based corrected signal PLL_FB_CLK. The bypass duty cycle correction circuit 120 is configured to correct the duty cycle of the input clock signal SPI_CLK_IN providing a bypass corrected signal. The multiplexer 130 receives the input clock signal SPI_CLK_IN, the PLL-based corrected signal PLL_FB_CLK and the bypass corrected signal. Accordingly, the multiplexer 130 selects one of the input clock signal SPI_CLK_IN, the PLL-based corrected signal PLL_FB_CLK and the bypass corrected signal as the output clock signal SPI_CLK_OUT.

The PLL-based duty cycle correction circuit 110 comprises a PLL circuit 112 and a frequency divider 114. In one embodiment, the PLL circuit 112 may comprises a phase detector, a loop filter and an oscillator (not shown). The PLL circuit 112 is configured to lock a frequency and a phase of the input clock signal SPI_CLK_IN, thereby generating a PLL output signal, which can be aligned with the input clock signal SPI_CLK_IN at rising edges. The PLL output signal of the PLL circuit 112 is further inputted to the frequency divider 114. The frequency divider 114 is configured to divide a frequency of the PLL output signal by a factor of N, and also correct the duty cycle of the PLL output signal. As such, the frequency divider 214 outputs the PLL-based corrected signal PLL_FB_CLK having a corrected duty cycle.

Specifically, the PLL-based duty cycle correction circuit 110 leverages the frequency divider 114 present in the feedback path of the PLL circuit 112. The frequency divider 114 possesses duty cycle correction capabilities, implying that it ensures a balanced distribution of high-level and low-level durations within the PLL-based corrected signal PLL_FB_CLK. Additionally, owing to the frequency-locking attributes of the PLL circuit 112, the PLL-based corrected signal PLL_FB_CLK can be in synchronization with the input clock signal SPI_CLK_IN in frequency and aligned with the input clock signal SPI_CLK_IN at rising edges. When the PLL-based corrected signal PLL_FB_CLK is selected as the output clock signal SPI_CLK_OUT, the output clock signal SPI_CLK_OUT can be in synchronization with the input clock signal SPI_CLK_IN in frequency but have a corrected duty cycle (i.e., 50%-50% duty cycle).

The bypass duty cycle correction circuit 120 comprises an OR gate 122 and a D flip-flop 124. The D flip-flop 124 receives a logic high signal (e.g., logic "1") at its D input and clocked by the input clock signal SPI_CLK_IN to sample the logic high signal. Specifically, the D flip-flop 230 samples the logic high signal upon rising edges of the input clock signal SPI_CLK_IN. Accordingly, the D flip-flop 124 outputs the bypass corrected signal its Q output. Moreover, the OR gate 122 receives the PLL-based corrected signal PLL_FB_CLK and a delayed version of the PLL-based corrected signal PLL_FB_CLK (i.e., a delayed PLL-based corrected signal FB_CLK_DLY), thereby to generates a reset signal Rest.

As the PLL-based corrected signal PLL_FB_CLK has already undergone duty cycle correction, falling edges of the PLL-based corrected signal PLL_FB_CLK are utilized to generate reset pulses of the reset signal Rest, which assists in correcting duty cycle of the input clock signal SPI_CLK_IN by using the reset pulses to have the bypass corrected signal to transition to a low level at right timings. Thus, when the bypass corrected signal is selected as the output clock signal SPI_CLK_OUT, the output clock signal SPI_CLK_OUT can be in synchronization with the input clock signal SPI_CLK_IN in frequency but have a corrected duty cycle (i.e., 50%-50% duty cycle).

A primary advantage of the bypass duty cycle correction circuit 120 is its ability to circumvent the issue of jitter accumulation that arises when multiple LTDI ICs are cascaded when using the PLL-based duty cycle correction. Since each PLL-based correction in the LTDI IC may potentially introduce temporal shifts to its output clock signal, which can cumulatively result in significant jitter as multiple LTDI ICs are cascaded. Therefore, the bypass duty cycle correction provides a means of avoiding this predicament.

Figure 4:
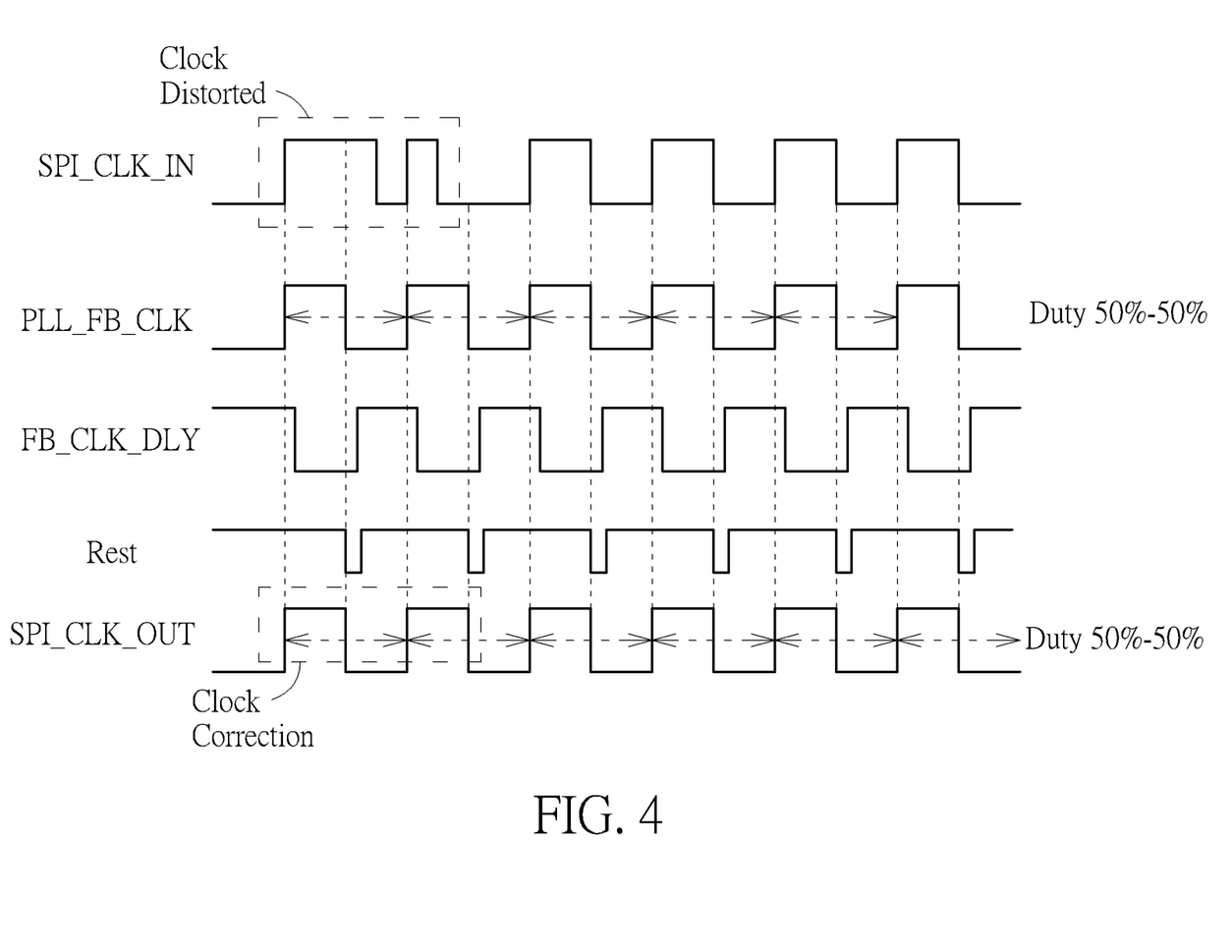
FIG. 4 illustrates a timing diagram of signals in the duty cycle correction device of FIG. 3 according to one embodiment of the present invention.

FIG. 4 illustrates a timing diagram of signals in the duty cycle correction device of FIG. 3 according to one embodiment of the present invention. As illustrated, rising edges of the PLL-based corrected signal PLL_FB_CLK and the output clock signal SPI_CLK_OUT are aligned with rising edges of the input clock signal SPI_CLK_IN. In addition, upon falling edges of the PLL-based corrected signal PLL_FB_CLK (which has a corrected duty cycle), the bypass corrected signal is reset the low level, thereby to correct the distorted duty cycle in the input clock signal SPI_CLK_IN.

Figure 5:
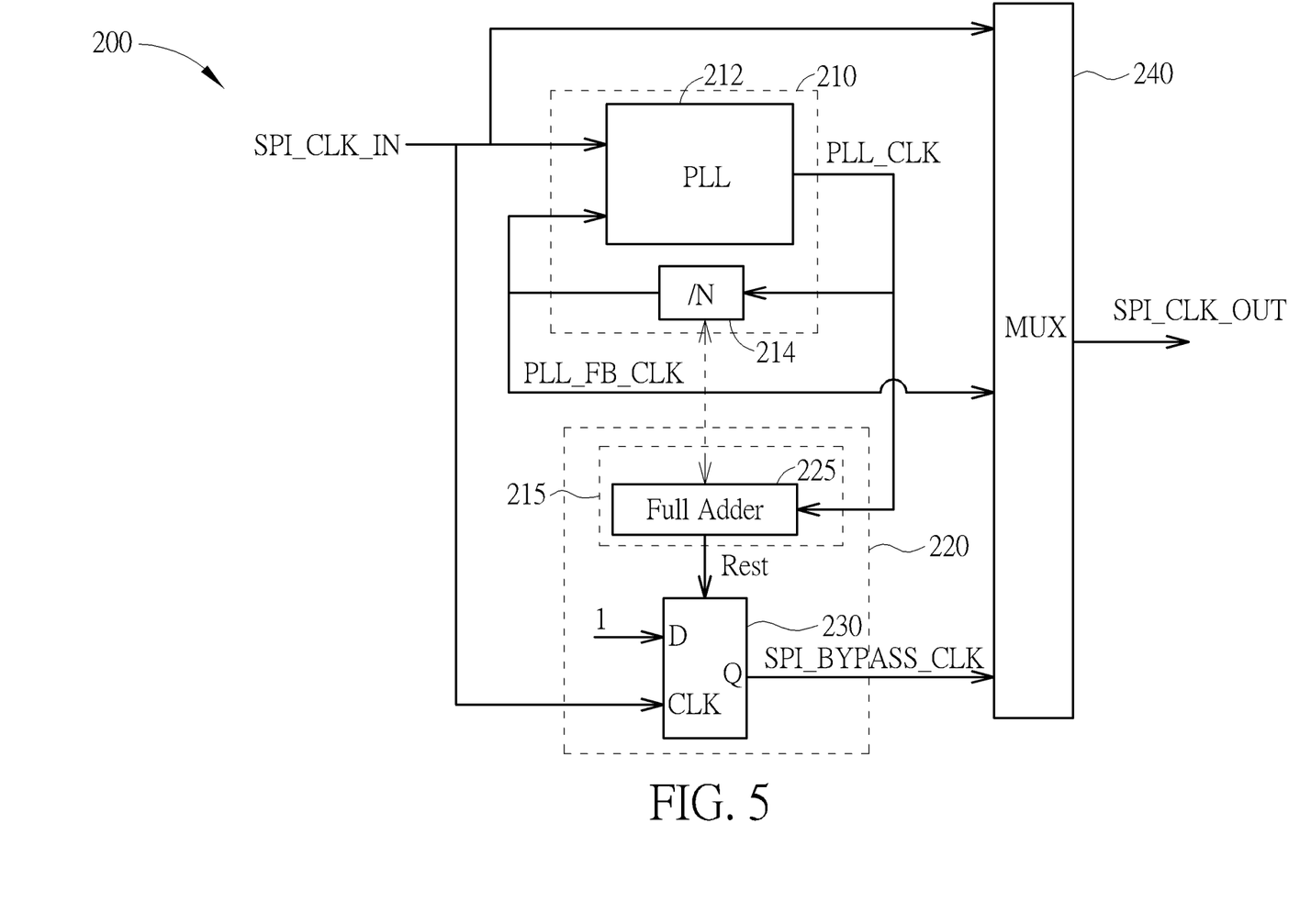
FIG. 5 illustrates a schematic diagram of a duty cycle correction device according to one embodiment of the present invention.

Please refer to FIG. 5, which illustrates a schematic diagram of a clock correction device according to one embodiment of the present invention. As depicted, a clock correction device 200 comprises a Phase-Locked Loop (PLL)-based duty cycle correction circuit 210, and a multiplexer 240. The clock correction device 200 receives an input clock signal SPI_CLK_IN and accordingly outputs an output clock signal SPI_CLK_OUT.

Both of the PLL-based duty cycle correction circuit 210 and the bypass duty cycle correction circuit 220 are configured to correct the duty cycle of the input clock signal SPI_CLK_IN. The PLL-based duty cycle correction circuit 210 is configured to correct the duty cycle of the input clock signal SPI_CLK_IN providing a PLL-based corrected signal PLL_FB_CLK. The bypass duty cycle correction circuit 220 is configured to correct the duty cycle of the input clock signal SPI_CLK_IN providing a bypass corrected signal SPI_BYPASS_CLK. The multiplexer 240 receives the input clock signal SPI_CLK_IN, the PLL-based corrected signal PLL_FB_CLK and the bypass corrected signal SPI_BY-PASS_CLK. Accordingly, the multiplexer 240 selects one of the input clock signal SPI_CLK_IN, the PLL-based corrected signal PLL_FB_CLK and the bypass corrected signal SPI_BYPASS_CLK as the output clock signal SPI_CLK_OUT.

The PLL-based duty cycle correction circuit 210 comprises a PLL circuit 212 and a frequency divider 214. In one embodiment, the PLL circuit 112 may comprises a phase detector, a loop filter and an oscillator (not shown). The PLL circuit 212 is configured to lock a frequency and a phase of the input clock signal SPI_CLK_IN, thereby generating a PLL output signal PLL_CLK, which can be aligned with the input clock signal SPI_CLK_IN at rising edges. The PLL output signal PLL_CLK is further inputted to the frequency divider 214. The frequency divider 214 is configured to divide a frequency of the PLL output signal PLL_CLK by a factor of N, and also correct the duty cycle of the PLL output signal PLL_CLK. As such, the frequency divider 214 outputs the PLL-based corrected signal PLL_FB_CLK having a corrected duty cycle.

The bypass duty cycle correction circuit 220 comprises a counting circuit 215 (including the full adder 225) and a D flip-flop 230. The D flip-flop 230 receives and is clocked by the input clock signal SPI_CLK_IN to sample a logic high signal (e.g., logic "1") at its D input and. Specifically, the D flip-flop 230 samples the logic high signal upon a rising edge of the input clock signal SPI_CLK_IN. Accordingly, the D flip-flop 230 outputs the bypass corrected signal SPI_BY-PASS_CLK at its Q output.

On the other hand, the PLL output signal PLL_CLK is inputted to the counting circuit 215 including the full adder 225. By using the full adder 225, the counting circuit 215 is configured to count a number of cycles of the PLL output signal PLL_CLK during a single period of the input clock signal SPI_CLK_IN. According to a counter value indicates the number of cycles of the PLL output signal PLL_CLK, the counting circuit 215 generates a reset signal Rest.

Figure 6:
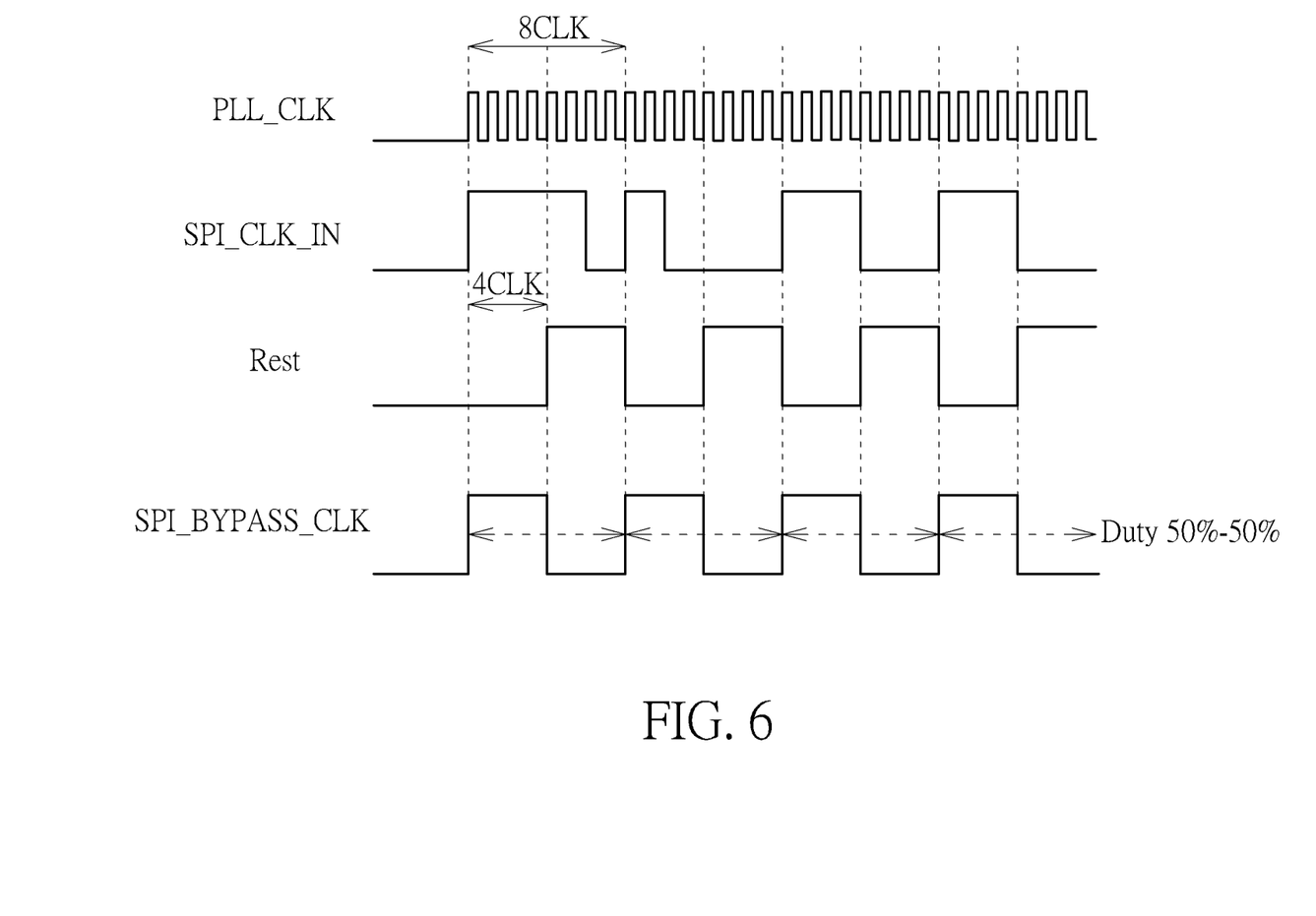
FIG. 6 illustrates a timing diagram of signals in the duty cycle correction device of FIG. 5 according to one embodiment of the present invention.

Please refer to FIG. 6, which illustrates a timing diagram of signals in the duty cycle correction device of FIG. 5 according to one embodiment of the present invention. As depicted in FIG. 6, there are 8 cycles of the PLL output signal PLL_CLK during a single period of the input clock signal SPI_CLK_IN, implying that the factor of N is 8. Additionally, the counting circuit 215 including the full adder 225 is configured to generate the reset signal Rest based on the counter value. Once the counter value reaches N/2 (e.g., 8/2=4), the counting circuit 215 will assert the reset signal Rest to have the bypass corrected signal SPI_BYPASS_CLK to transition to the logic low level. On the other hand, once the counter value reaches N, the counting circuit 215 will de-assert the reset signal Rest. As such, the bypass corrected signal SPI_BYPASS_CLK could be in synchronization with the input clock signal SPI_CLK_IN but have a corrected duty cycle.

Figure 7:
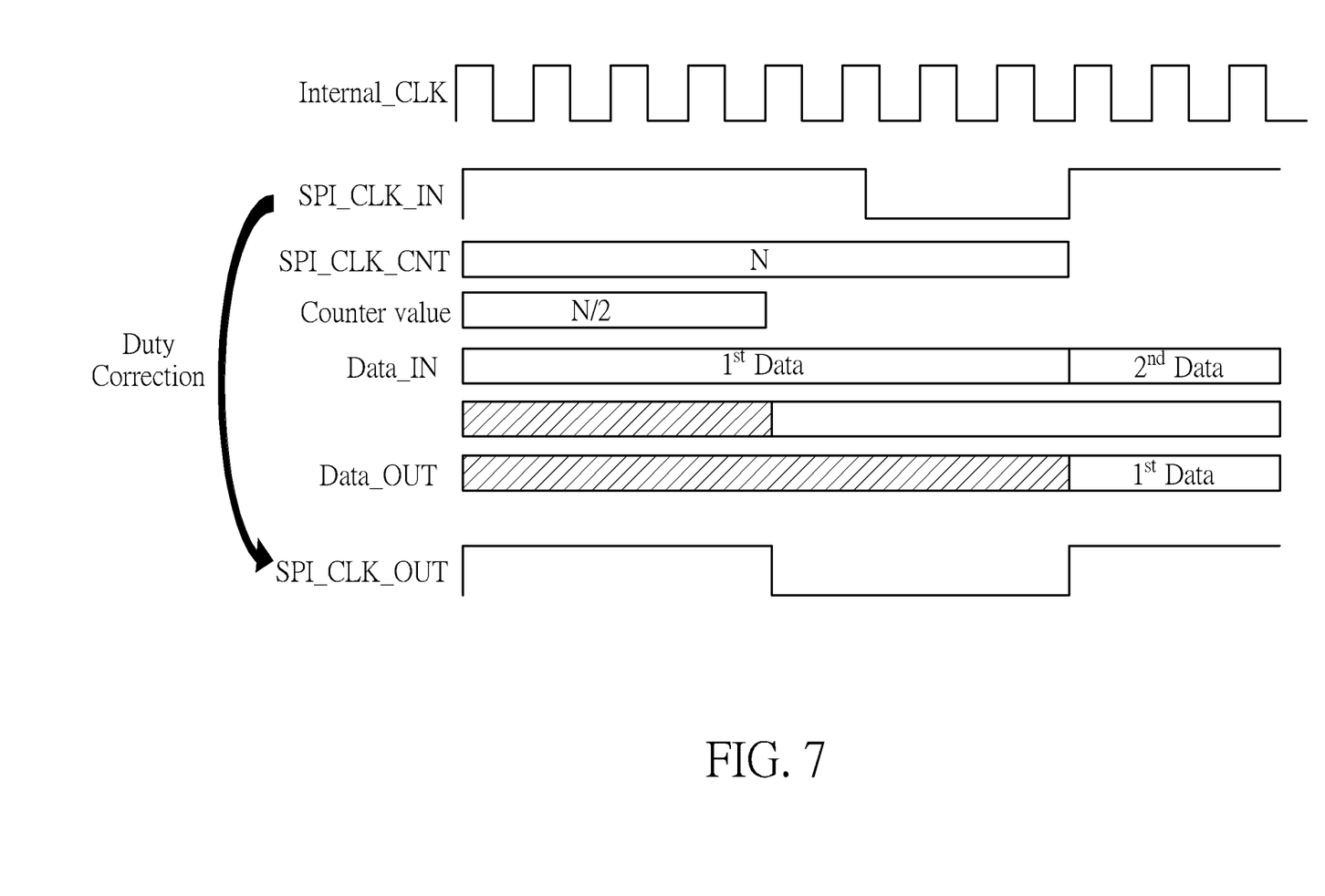
FIG. 7 illustrates a timing diagram of signals in an LTDI IC using the duty cycle correction device of FIG. 5 according to one embodiment of the present invention.

FIG. 7 illustrates a timing diagram of signals in a LTDI IC using the duty cycle correction device of FIG. 5 according to one embodiment of the present invention. As depicted, when counter value reaches N/2 during one period of the input clock signal SPI_CLK_IN, the output clock signal SPI_CLK_OUT (i.e., when the bypass corrected signal SPI_BYPASS_CLK is selected) will transition to the low level. When counter value reaches N, the output clock signal SPI_CLK_OUT (i.e., the bypass corrected signal SPI_BY-PASS_CLK is selected) will transition to the high level since the reset signal Rest is not activated and the logical high signal is again sampled by the D flip-flop 230 at the rising edge of the input clock signal SPI_CLK_IN. Moreover, upon the falling edge of output clock signal SPI_CLK_OUT, the data signal Data_IN is latched. Upon the rising edge of output clock signal SPI_CLK_OUT, the latched data signal Data_OUT is sent.

In one embodiment, the selection strategy for the output clock signal SPI_CLK_OUT, determined by multiplexers 130 and 240, is based on the count of LTDI ICs included within the LTDI system. Specifically, if the LTDI system encompasses a minimal number of LTDI ICs, both multiplexers 130 and 240 may opt to use the input clock signal SPI_CLK_IN as the output clock signal SPI_CLK_OUT (without correction). In instances where the LTDI system comprises a moderate or substantial number of LTDI ICs, the multiplexers 130 and 240 may prefer the bypass corrected signal SPI_BYPASS_CLK to serve as the output clock signal SPI_CLK_OUT, thereby mitigating potential jitter accumulation (caused by the PLL circuit). However, in scenarios where jitter accumulation is not a significant concern, the multiplexers 130 and 240 can select the PLL-based corrected signal PLL_FB_CLK as the output clock signal SPI_CLK_OUT.

In conclusion, when multiple ICs are deployed in a cascade arrangement and share a same clock signal, each IC may add a certain amount of loading to the clock signal, potentially causing distortion in the duty cycle of the clock signal. This distortion can become significant by the time the clock signal reaches the last IC in the cascade arrangement, due to the cumulative effect of the loading. This could lead to a near disappearance or severe distortion of the clock signal. Such distortions could impact the data signal's setup time and hold time, parameters that are determined by the edges of the clock signal. Any variation in the position of clock edges could result in errors during the setup or hold time of the data signal, potentially disrupting the correct operation of the whole system. Addressing this challenge, the present invention employs a duty cycle correction device that features a dual duty cycle correction mechanism. The first is a PLL-based duty cycle correction that effectively rectifies any distortion in the duty cycle of the clock signal. Additionally, the present invention incorporates a bypass duty cycle correction as an alternative. This bypass duty cycle correction mechanism is designed to rectify distortions in the duty cycle of the clock signal similarly, but it is particularly advantageous when the PLL-based duty cycle correction risks inducing severe jitter accumulation caused by the PLL circuit. The bypass duty cycle correction can be deployed to replace the PLL-based duty cycle correction under such circumstances, providing flexibility and improved performance.

Embodiments in accordance with the present embodiments can be implemented as an apparatus, method, or computer program product. Accordingly, the present embodiments may take the form of an entirely hardware embodiment, an entirely software embodiment, or an embodiment combining software and hardware aspects that can all generally be referred to herein as a "module" or "system." Furthermore, the present embodiments may take the form of a computer program product embodied in any tangible medium of expression having computer-usable program code embodied in the medium. In terms of hardware, the present invention can be accomplished by applying any of the following technologies or related combinations: an individual operation logic with logic gates capable of performing logic functions according to data signals, and an application specific integrated circuit (ASIC), a programmable gate array (PGA) or a field programmable gate array (FPGA) with a suitable combinational logic.

The flowchart and block diagrams in the flow diagrams illustrate the architecture, functionality, and operation of possible implementations of systems, methods, and computer program products according to various embodiments of the present embodiments. In this regard, each block in the flowchart or block diagrams may represent a module, segment, or portion of code, which comprises one or more executable instructions for implementing the specified logical function(s). It is also noted that each block of the block diagrams and/or flowchart illustrations, and combinations of blocks in the block diagrams and/or flowchart t illustrations, can be implemented by special purpose hardware-based systems that perform the specified functions or acts, or combinations of special purpose hardware and computer instructions. These computer program instructions can be stored in a computer-readable medium that directs a computer or other programmable data processing apparatus to function in a particular manner, such that the instructions stored in the computer-readable medium produce an article of manufacture including instruction means which implement the function/act specified in the flowchart and/or block diagram block or blocks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A duty cycle correction device, comprising:
   a phase-locked Loop (PLL)-based duty cycle correction circuit, configured to correct a duty cycle of an input clock signal to generate a PLL-based corrected signal;
   a bypass duty cycle correction circuit, coupled to the PLL-based duty cycle correction circuit, configured to be clocked by the input clock signal to sample a logic signal at its input terminal to correct the duty cycle of the input clock signal, thereby generating a bypass corrected signal, comprising:
   an OR gate, configured to have an OR operation on the PLL-based corrected signal and a delayed version of the PLL-based corrected signal to generate a reset signal; and
   a D flip-flop, coupled to the OR gate and the multiplexer, configured to be clocked by the input clock signal to sample a logic high signal and to be reset by the reset signal, thereby to generate the bypass corrected signal; and
   a multiplexer, coupled to the PLL-based duty cycle correction circuit and the bypass duty cycle correction circuit, configured to select one of the PLL-based corrected signal, the bypass corrected signal and the input clock signal as an output clock signal.

2. The duty cycle correction device of claim 1, wherein the PLL-based duty cycle correction circuit comprises:
   a PLL circuit, configured to generate a PLL output signal according to the input clock signal; and
   a frequency divider, coupled to the PLL circuit, configured to divide a frequency of the PLL output signal by a factor of N to generate the PLL-based corrected signal.

3. A display and touch control system, comprising:
   a plurality of display and touch control circuits in a cascade arrangement, each of which having a clock input terminal, a clock output terminal, a data input terminal, a data output terminal, wherein the clock output terminal of one of the display and touch control circuits is coupled to the clock input terminal of a succeeding one of the display and touch control circuits, and each display and touch control circuit comprises:
   a duty cycle correction device, comprising:
      a phase-locked Loop (PLL)-based duty cycle correction circuit, configured to correct a duty cycle of an input clock signal at the clock input terminal to generate a PLL-based corrected signal;
      a bypass duty cycle correction circuit, coupled to the PLL-based duty cycle correction circuit, configured to be clocked by the input clock signal to sample a logic signal at its input terminal to correct the duty cycle of the input clock signal, thereby generating a bypass corrected signal, comprising:
         an OR gate, configured to have an OR operation on the PLL-based corrected signal and a delayed version of the PLL-based corrected signal to generate a reset signal; and
         a D flip-flop, coupled to the OR gate and the multiplexer, configured to be clocked by the input clock signal to sample a logic high signal and to be reset by the reset signal, thereby to generate the bypass corrected signal; and
      a multiplexer, coupled to the PLL-based duty cycle correction circuit and the bypass duty cycle correction circuit, configured to select one of the PLL-based corrected signal, the bypass corrected signal and the input clock signal as an output clock signal at the clock output terminal.

4. The display and touch control system of claim 3, wherein each one of the display and touch control circuits is configured to latch a data signal at the data input terminal at a falling edge of the output clock signal and send the latched data signal to a succeeding one of the display and touch control circuits at a rising edge of the output clock signal.

5. The display and touch control system of claim 3, wherein the PLL-based duty cycle correction circuit comprises:
   a PLL circuit, configured to generate a PLL output signal according to the input clock signal; and
   a frequency divider, coupled to the PLL circuit, configured to divide a frequency of the PLL output signal by a factor of N to generate the PLL-based corrected signal.

6. A duty cycle correction device, comprising:
   a phase-locked Loop (PLL)-based duty cycle correction circuit, configured to correct a duty cycle of an input clock signal to generate a PLL-based corrected signal;
   a bypass duty cycle correction circuit, coupled to the PLL-based duty cycle correction circuit, configured to be clocked by the input clock signal to sample a logic signal at its input terminal to correct the duty cycle of the input clock signal, thereby generating a bypass corrected signal, comprising:
      a counting circuit, coupled to a PLL circuit of the PLL-based duty cycle correction circuit, configured to count a number of cycles of a PLL output signal generated by the PLL circuit during one period of the input clock signal and accordingly generate a reset signal according to a counter value; and
      a D flip-flop, coupled to the counting circuit and the multiplexer, configured to be clocked by the input clock signal to sample a logic high signal and to be reset by the reset signal, thereby to generate the bypass corrected signal; and
   a multiplexer, coupled to the PLL-based duty cycle correction circuit and the bypass duty cycle correction circuit, configured to select one of the PLL-based corrected signal, the bypass corrected signal and the input clock signal as an output clock signal.

7. The duty cycle correction device of claim 6, wherein a frequency divider of the PLL-based duty cycle correction circuit is configured to divide a frequency of the PLL output signal by a factor of N to generate the PLL-based corrected signal; when the counter value indicates the number cycles of the PLL output signal that are received by the counting circuit during one period of the input clock signal reaches N/2, the counting circuit is configured to assert the reset signal, and when the counter value indicates the number cycles of the PLL output signal that are received by the counting circuit during one period of the input clock signal reaches N, the counting circuit is configured to de-assert the reset signal.

8. A display and touch control system comprising the duty cycle correction circuit of claim 6.

\* \* \* \* \*